(12) United States Patent
Koudymov et al.

(10) Patent No.: US 8,497,527 B2
(45) Date of Patent: Jul. 30, 2013

(54) DEVICE HAVING ACTIVE REGION WITH LOWER ELECTRON CONCENTRATION

(75) Inventors: Alexei Koudymov, Troy, NY (US); Michael Shur, Latham, NY (US); Remigijus Gaska, Columbia, SC (US)

(73) Assignee: Sensor Electronic Technology, Inc., Columbia, SC (US)

( * ) Notice: Subject to any disclaimer, the term of this patent is extended or adjusted under 35 U.S.C. 154(b) by 486 days.

(21) Appl. No.: 12/402,526

(22) Filed: Mar. 12, 2009

(65) Prior Publication Data

US 2009/0230331 A1     Sep. 17, 2009

Related U.S. Application Data

(60) Provisional application No. 61/069,101, filed on Mar. 12, 2008.

(51) Int. Cl.
*H01L 29/66*     (2006.01)

(52) U.S. Cl.
USPC ........... 257/183; 257/587; 257/592; 257/173; 257/355; 257/577; 257/256; 257/257; 257/258; 257/259

(58) Field of Classification Search
USPC ................. 257/183, 184–200, 213–221, 231, 257/256–259
See application file for complete search history.

(56) References Cited

U.S. PATENT DOCUMENTS

| | | | | |
|---|---|---|---|---|
| 5,270,798 A | * | 12/1993 | Pao et al. ...................... | 257/134 |
| 5,385,865 A | * | 1/1995 | Nieder et al. ................. | 438/238 |
| 5,473,175 A | * | 12/1995 | Nikaido et al. ............... | 257/192 |
| 5,929,467 A | * | 7/1999 | Kawai et al. .................. | 257/192 |
| 5,942,447 A | * | 8/1999 | Miyakuni ..................... | 438/740 |
| 6,015,981 A | * | 1/2000 | Gluck ........................... | 257/194 |
| 6,110,278 A | * | 8/2000 | Saxena ........................... | 117/95 |
| 6,274,893 B1 | * | 8/2001 | Igarashi et al. ............... | 257/192 |
| 6,333,516 B1 | * | 12/2001 | Katoh et al. .................... | 257/22 |
| 6,627,552 B1 | * | 9/2003 | Nishio et al. .................. | 438/694 |
| 6,841,809 B2 | * | 1/2005 | Fareed et al. ................. | 257/192 |
| 6,965,128 B2 | * | 11/2005 | Holm et al. ................... | 257/103 |
| 6,987,484 B2 | * | 1/2006 | Von Klitzing et al. ........ | 343/701 |
| 6,989,553 B2 | * | 1/2006 | Yokogawa et al. ............. | 257/77 |
| 7,376,403 B1 | * | 5/2008 | Wanke et al. .............. | 455/189.1 |
| 7,420,225 B1 | * | 9/2008 | Wanke et al. ................. | 257/192 |

(Continued)

OTHER PUBLICATIONS

Barker et al., "High-Field Electron Transport in AlGaN/GaN Heterostructures", Phys. Stat. Sol. (c) 2, No. 7, pp. 2564-2568, 2005.

(Continued)

*Primary Examiner* — Fernando L Toledo
*Assistant Examiner* — Mohammed Shamsuzzaman
(74) *Attorney, Agent, or Firm* — LaBatt, LLC

(57) ABSTRACT

A device comprising a two-dimensional electron gas that includes an active region located in a portion of the electron gas is disclosed. The active region comprises an electron concentration less than an electron concentration of a set of non-active regions of the electron gas. The device includes a controlling terminal located on a first side of the active region. The device can comprise, for example, a field effect transistor (FET) in which the gate is located and used to control the carrier injection into the active region and define the boundary condition for the electric field distribution within the active region. The device can be used to generate, amplify, filter, and/or detect electromagnetic radiation of radio frequency (RF) and/or terahertz (THz) frequencies.

16 Claims, 6 Drawing Sheets

U.S. PATENT DOCUMENTS

| | | | |
|---|---|---|---|
| 7,525,130 B2* | 4/2009 | Mishra et al. | 257/183 |
| 7,619,263 B2* | 11/2009 | Shur et al. | 257/198 |
| 7,638,817 B2* | 12/2009 | Shur et al. | 257/187 |
| 7,638,818 B2* | 12/2009 | Wu et al. | 257/192 |
| 7,675,090 B2* | 3/2010 | Sadaka et al. | 257/194 |
| 7,705,415 B1* | 4/2010 | Nabet | 257/449 |
| 7,898,002 B2* | 3/2011 | Hikita et al. | 257/192 |
| 7,915,643 B2* | 3/2011 | Suh et al. | 257/194 |
| 7,932,539 B2* | 4/2011 | Chen et al. | 257/194 |
| 7,955,882 B2* | 6/2011 | Shur et al. | 438/47 |
| 8,076,699 B2* | 12/2011 | Chen et al. | 257/194 |
| 8,093,626 B2* | 1/2012 | Niiyama et al. | 257/192 |
| 8,114,717 B2* | 2/2012 | Palacios et al. | 438/142 |
| 8,237,198 B2* | 8/2012 | Wu et al. | 257/194 |
| 2002/0011617 A1* | 1/2002 | Kubo et al. | 257/301 |
| 2003/0057507 A1* | 3/2003 | Bozso et al. | 257/428 |
| 2004/0201076 A1* | 10/2004 | Shur et al. | 257/462 |
| 2005/0099345 A1* | 5/2005 | von Klitzing et al. | 343/703 |
| 2005/0230705 A1* | 10/2005 | Taylor | 257/120 |
| 2006/0226440 A1* | 10/2006 | Pan | 257/188 |
| 2006/0289761 A1* | 12/2006 | Nabet et al. | 250/336.1 |
| 2007/0224710 A1* | 9/2007 | Palacios et al. | 438/12 |
| 2007/0295993 A1* | 12/2007 | Chen et al. | 257/194 |
| 2008/0081390 A1* | 4/2008 | Gaska et al. | 438/37 |
| 2008/0290371 A1* | 11/2008 | Sheppard et al. | 257/192 |
| 2008/0308813 A1* | 12/2008 | Suh et al. | 257/76 |
| 2009/0032820 A1* | 2/2009 | Chen | 257/76 |
| 2009/0050933 A1* | 2/2009 | Shiba et al. | 257/186 |
| 2009/0072272 A1* | 3/2009 | Suh et al. | 257/194 |
| 2009/0146185 A1* | 6/2009 | Suh et al. | 257/194 |
| 2010/0068855 A1* | 3/2010 | Saxler et al. | 438/172 |
| 2010/0072407 A1* | 3/2010 | Shur et al. | 250/505.1 |
| 2010/0084687 A1* | 4/2010 | Chen et al. | 257/194 |
| 2010/0102359 A1* | 4/2010 | Khan et al. | 257/194 |
| 2010/0264461 A1* | 10/2010 | Rajan et al. | 257/194 |
| 2010/0283083 A1* | 11/2010 | Niiyama et al. | 257/192 |
| 2010/0289122 A1* | 11/2010 | Vaudo et al. | 257/615 |
| 2011/0018040 A1* | 1/2011 | Smith et al. | 257/288 |
| 2011/031494 A1* | 2/2011 | Fujii et al. | 257/43 |
| 2011/0049566 A1* | 3/2011 | Perera et al. | 257/185 |
| 2011/0136305 A1* | 6/2011 | Saxler et al. | 438/172 |
| 2012/0175680 A1* | 7/2012 | Suh et al. | 257/194 |

OTHER PUBLICATIONS

Ryzhii et al., Plasma Wave Electronic Devices, 2003 International Semiconductor Device Research Symposium Proceedings, pp. 200-201, Dec. 2003.

Koudymov et al., "Analytical HFET I-V Model in Presence of Current Collapse", IEEE Transactions on Electron Devices, vol. 55, Issue 3, pp. 712-720 (37 pages provided), 2008.

* cited by examiner

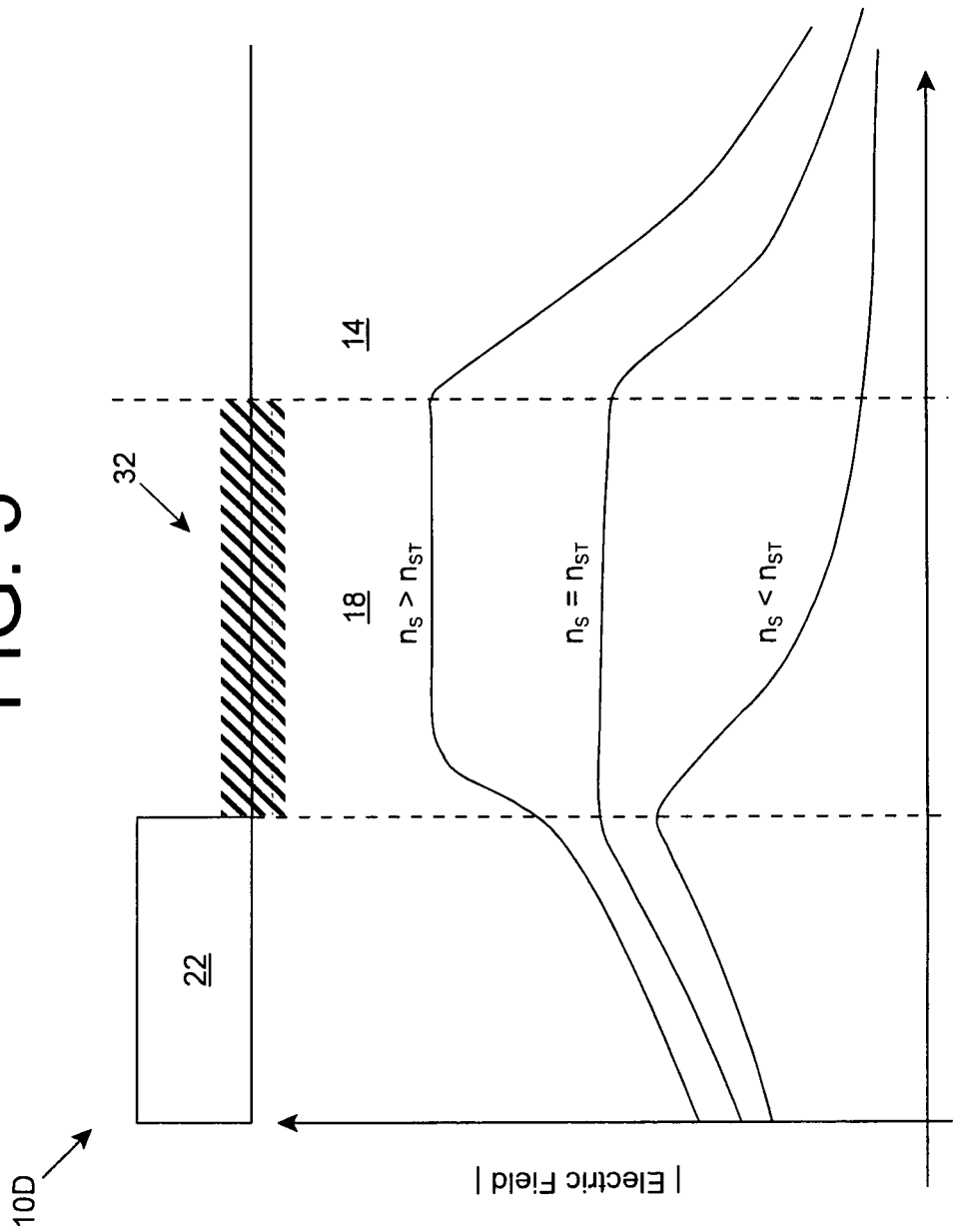

DEVICE HAVING ACTIVE REGION WITH LOWER ELECTRON CONCENTRATION

REFERENCE TO PRIOR APPLICATION

The current application claims the benefit of U.S. Provisional Application No. 61/069,101, titled "Two-dimensional semiconductor oscillator," which was filed on 12 Mar. 2008, and which is hereby incorporated by reference.

TECHNICAL FIELD

The disclosure relates generally to high power, high frequency solid state devices, and more particularly, to tens to thousands micrometer radio-frequency (RF) and terahertz frequency oscillators, amplifiers, and detectors capable of operating at room temperature.

BACKGROUND ART

Devices that function as sources, amplifiers, and detectors of terahertz (THz) and millimeter wave radiation are of great interest due to potential applications for systems that utilize such devices. For example, a spectroscopic system operating at such ranges of radiation can detect complex chemical and biological compounds, live objects, and other features. Current applications of THz spectroscopy also include such important areas as deep space monitoring, radar applications, etc. However, to date, there is lack of fast solid state devices operating at these frequencies that can be used to build relatively cheap, fast and compact spectroscopic systems. As a result, most THz sources are bulky, fairly effective, and can only operate at cryogenic temperatures.

Gunn effect oscillators and amplifiers are well known to successfully operate at room temperature. Commercially available Gunn effect devices are based on bulk three-dimensional Gallium Arsenic (GaAs) active elements with or without a controlling electrode, placed into the resonator. Due to specific material related issues of GaAs, these devices have frequency limitations in the THz frequency range making them practically useless even at sub-terahertz frequencies without frequency multipliers, and extremely inefficient at frequencies above 100 gigahertz (GHz). Also, Gunn effect devices with large cross-sections have significant coherency problems and skin effect related issues.

Gallium Nitride (GaN)-based devices are much more promising for high frequency oscillation applications because of their higher (about at least two times) saturation velocities, higher breakdown fields, and better thermal properties than GaAs-based devices. Additionally, high densities of the two-dimensional electron populations available in GaN-based heterostructures make it possible to achieve plasma wave and negative differential mobility related instabilities in the two-dimensional electron plasma, which addresses the skin effect issues. Also, in two-dimensional structures, it is possible to use controlling electrodes (gates) that allow changing the carrier densities and electric field distributions independently, thus eliminating the effect of parasitic series resistances.

SUMMARY OF THE INVENTION

Aspects of the invention provide a device comprising a two-dimensional electron gas that includes an active region located in a portion of the electron gas. The active region comprises an electron concentration less than an electron concentration of a set of non-active regions of the electron gas. The device includes a controlling terminal located on a first side of the active region. The device can comprise, for example, a field effect transistor (FET) in which the gate is located and used to control the carrier injection into the active region and define the boundary condition for the electric field distribution within the active region. The device can be used to generate, amplify, filter, and/or detect electromagnetic radiation of radio frequency (RF) and/or terahertz (THz) frequencies.

A first aspect of the invention provides a device comprising: a two-dimensional electron gas located between a first layer and a second layer; an active region located in a portion of the electron gas, wherein the active region comprises an electron concentration less than an electron concentration of a set of non-active regions of the electron gas; and a controlling terminal located on the second layer and on a first side of the active region.

A second aspect of the invention provides a method of manufacturing a device, the method comprising: forming an active region in a portion of a two-dimensional electron gas located between a first layer and a second layer of a heterostructure, wherein the active region comprises an electron concentration less than an electron concentration of a set of non-active regions of the electron gas; and forming a controlling terminal on the second layer and on a first side of the active region.

A third aspect of the invention provides a method of generating electromagnetic radiation, the method comprising: supplying a current from a first supplying terminal to a second supplying terminal along a channel comprising a two-dimensional electron gas located between the first supplying terminal and the second supplying terminal to generate the electromagnetic radiation, the electron gas including an active region having an electron concentration less than an electron concentration of a set of non-active regions of the electron gas; and applying a voltage to a controlling terminal located on a first side of the active region corresponding to the first supplying terminal to alter at least one characteristic of the electromagnetic radiation.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIG. 5 shows the electric field distributions in an active region of an illustrative device at various injection levels according to an embodiment.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, aspects of the invention provide a device comprising a two-dimensional electron gas that includes an active region located in a portion of the electron gas. The active region comprises an electron concentration less than an electron concentration of a set of non-active regions of the electron gas. The device includes a controlling terminal located on a first side of the active region. The device can comprise, for example, a field effect transistor (FET) in which the gate is located and used to control the carrier injection into the active region and define the boundary condition for the electric field distribution within the active region. The device can be used to generate, amplify, filter, and/or detect electromagnetic radiation of radio frequency (RF) and/or terahertz (THz) frequencies. As used herein, unless otherwise noted, the term "set" means one or more (i.e., at least one) and the phrase "any solution" means any now known or later developed solution.

Figure 1:
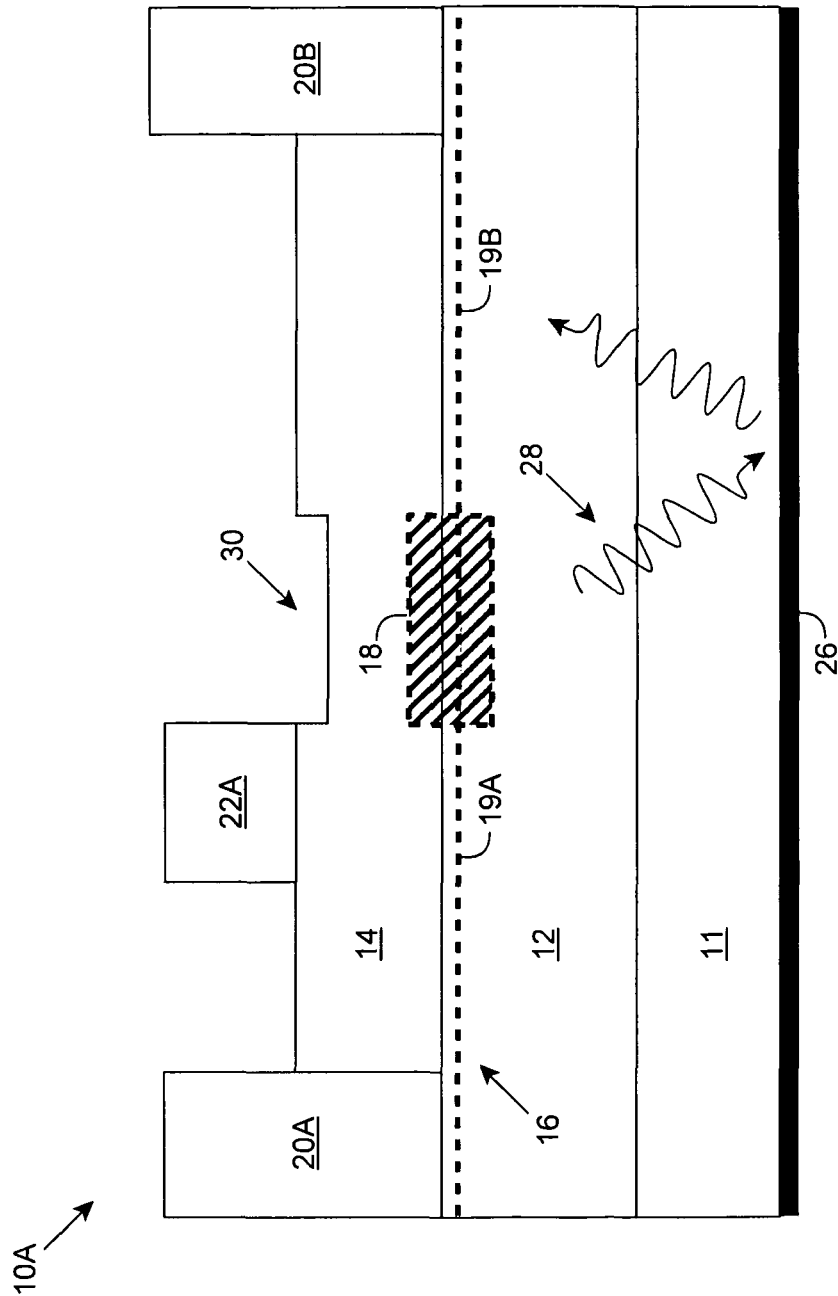
FIG. 1 shows an illustrative device according to an embodiment.

Turning to the drawings, FIG. 1 shows an illustrative device 10A according to an embodiment. Device 10A includes a buffer layer 12 and a barrier layer 14, which can be formed over a substrate 11. A two-dimensional electron gas 16 is formed at the heterointerface between buffer layer 12 and barrier layer 14. Device 10A includes an active region 18 formed in a portion of the electron gas 16. Active region 18 has an intentionally reduced electron concentration that is lower than an electron concentration of the non-active region(s) 19A, 19B of the electron gas 16. For example, active region 18 can have an electron concentration that is approximately ten percent to ninety percent lower than the electron concentration of non-active region(s), 19A, 19B of the electron gas 16. Additionally, device 10A includes supplying terminals (e.g., contacts) 20A, 20B, which are configured to pass a current through electron gas 16, and a controlling terminal (e.g., electrode) 22A, which is configured to control the current carrier injection into active region 18. Controlling terminal 22A is located outside of active region 18. For example, controlling terminal 22A is located on barrier layer 14 on a side of active region 18 that is closer to supplying terminal 20A. Device 10A can also include a reflecting plane 26 formed, for example, on a back side of the substrate 11.

Device 10A can be operated to generate electromagnetic radiation 28 by supplying a current between supplying terminals 20A, 20B, which results in the generation of electromagnetic radiation 28 from active region 18. In an embodiment, the terminal located closer to controlling terminal 22A, e.g., terminal 20A, operates as a source terminal and the other terminal, e.g., terminal 20B, operates as a drain terminal for the current. A voltage can be applied to controlling terminal 22A to control an impedance of the active region 18. In particular, a voltage difference between the controlling terminal 22A and another terminal on device 10A (e.g., supplying terminal 20A or 20B) and/or a current flowing from controlling terminal 22A and the other terminal on device 10A controls the impedance of the active region 18. By adjusting the impedance of the active region 18, one or more characteristics of the generated electromagnetic radiation 28 are altered. Reflecting plane 26 acts as a reflector for the generated electromagnetic radiation 28 and can provide direction and control of the electromagnetic radiation 28 and/or allow for the creation of a resonant condition in device 10A.

Device 10A generates electromagnetic radiation 28 based on the active region 18 of electron gas 16 having a high lateral electric field created along active region 18 and/or the current carrier injection into active region 18 being independently controlled using controlling terminal 22A. To this extent, controlling terminal 22A can be used to create a near-velocity-saturating electric field parallel to electron gas 16 in active region 18. The electromagnetic radiation 28 emitted by device 10A can have a frequency that is within the radio frequency (RF) range of frequencies, e.g., from 3 megahertz (MHz) to 300 gigahertz (GHz), or can have a frequency that is within the terahertz (THz) range of frequencies, e.g., from 300 GHz to 10 THz.

Figure 2:
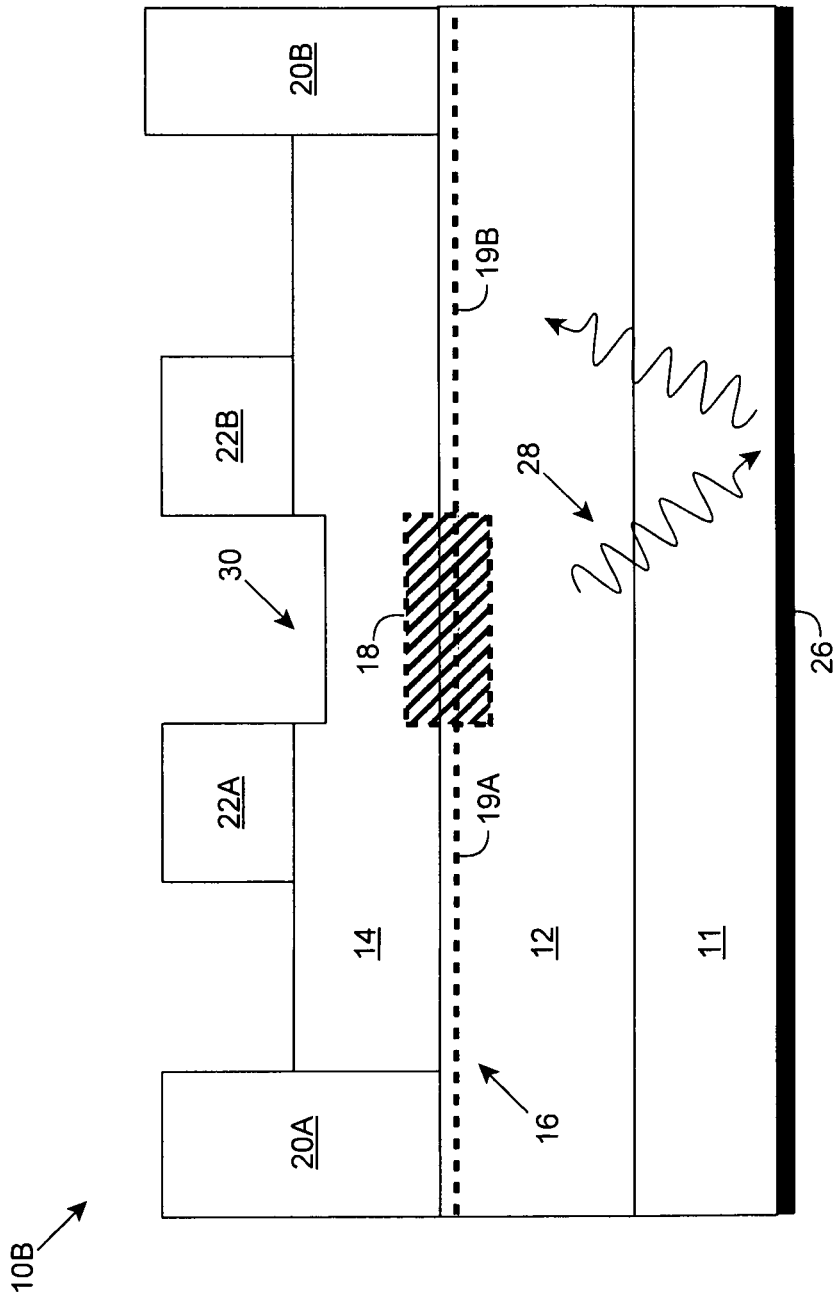
FIG. 2 shows another illustrative device according to an embodiment.

FIG. 2 shows another illustrative device 10B according to an embodiment. Device 10B is similar to device 10A (FIG. 1), but comprises a second controlling terminal 22B, which is located on an opposing side of active region 18 from controlling terminal 22A. In this configuration, the supplying terminal 20A, 20B, which operates as the source for the current when the device 10B is operated as described above can be readily changed. In particular, when supplying terminal 20A is utilized as the source, controlling terminal 22A can be used to control the carrier injection into the active region 18. However, when supplying terminal 20B is utilized as the source, controlling terminal 22B can be used to control the carrier injection into the active region 18. Further, the controlling terminal 22A, 22B that is not being used to control the carrier injection into the active region 18 can be positively biased to limit an extension of the active region 18 towards the supplying terminal 20A, 20B operating as the drain.

Figure 3:
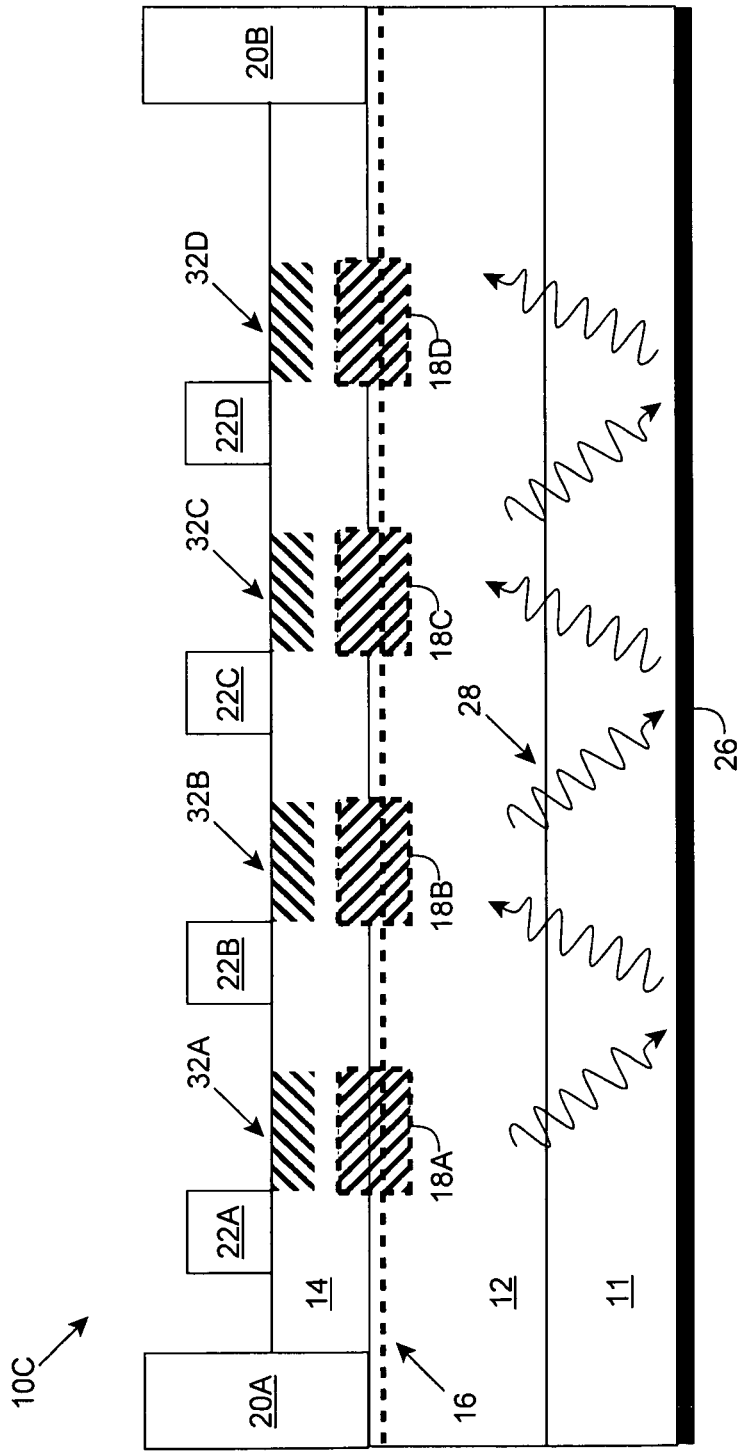
FIG. 3 shows still another illustrative device according to an embodiment.

FIG. 3 shows still another illustrative device 10C according to an embodiment. Device 10C includes an array of active regions 18A-18D, each with a corresponding controlling terminal 22A-22D, respectively, which are located between a shared pair of supplying terminals 20A, 20B. It is understood that while four active regions 18A-18D are shown, any number of one or more active regions can be implemented. Further, while each active region 18A-18D is shown having a single corresponding controlling terminal 22A-22D, it is understood that one or more of the active regions 18A-18D can comprise a pair of controlling terminals as illustrated in device 10B (FIG. 2).

A series connection of active regions 18A-18D suggests that an average number of carriers injected into each active region 18A-18D per unit time is approximately the same. Fine tuning that allows active regions 18A-18D to act synchronously can be performed by varying a voltage applied to each controlling terminal 22A-22D and/or adjusting a total voltage bias between source supplying terminal 20A and drain supplying terminal 20B.

In an embodiment, one or more active regions 18A-18D can be placed in parallel between supplying terminals 20A, 20B, with at least some of the parallel active regions 18A-18D including a corresponding controlling terminal 22A-22D. To this extent, the placement of active regions in parallel and/or series can be selected based on a circuit configuration in which the device will be utilized using any solution. Still further, an embodiment provides a device intentionally designed to have two or more channels (current paths) between supplying terminals 20A, 20B and at least two of the channels connected in series, and with one or more of the channels including active region(s). Still further, an embodiment provides multiple devices, such as device 10A of FIG. 1, configured in an array (e.g., implemented adjacent to one another and/or sharing a supplying terminal 20A, 20B), and sharing a single reflecting plane 26. Use of multiple channels and/or an array of multiple devices can enable the device(s) to provide higher power and/or provide additional flexibility in circuit matching.

In an embodiment, an illustrative device 10A-10C shown in FIGS. 1-3 can be operated as a semiconductor oscillator, which generates electromagnetic radiation 28 having a frequency in the THz range of frequencies. Referring to device 10A of FIG. 1 as an example, the high frequency oscillations of the electron concentration in the ungated active region(s) 18 of device 10A develop due to the effect of negative differential mobility at high electric fields and/or due to the plasma wave instability. The controlling electrode 22A adjacent to (but not overlying) the active region 18 controls the carrier injection into the active region 18 and defines the boundary condition for the electric field distribution within the active region 18. Devices 10A-10C can be used to generate, amplify, filter or detect the electromagnetic radiation of RF and THz frequencies.

Each illustrative device 10A-10C shown in FIGS. 1-3 comprises a field effect transistor (FET) in which the controlling terminal(s) 22A-22D are gates of the FET. To this extent, it is understood that each device 10A-10C can comprise any type of FET now known or later developed. For example, a device 10A-10C can comprise a heterostructure FET (HFET), an inverted heterostructure FET, a junction FET, an insulated gate FET, a metal semiconductor FET, a doped channel metal-semiconductor FET, a metal oxide semiconductor FET, a metal insulator semiconductor FET, a doped channel metal-insulator-semiconductor FET, high electron mobility transistor, double heterostructure FET, etc.

However, it is understood that the active region(s) and corresponding controlling electrode(s) can be implemented on any type of device having a two-dimensional electron gas. For example, an embodiment of the invention provides any type of bipolar junction transistor (BJT) now known or later developed (e.g., a heterojunction bipolar transistor, an insulated gate bipolar junction transistor, etc.), which includes one or more of the unique aspects of the invention shown and described herein. Further, it is understood that a single terminal can function as both a supplying and a controlling terminal. To this extent, an embodiment of the invention provides a two-terminal switching device, such as any type of semiconductor diode now known or later developed, which includes one or more of the unique aspects of the invention shown and described herein.

The illustrative devices 10A-10C shown in FIGS. 1-3 can be operated in high power, high frequency applications including, but not limited to, oscillators, radars, detectors, RF and THz amplifiers, generators, spectroscopic systems, etc. Additionally, contrary to alternative devices (e.g., Gunn diode designs), the illustrative devices 10A-10C can be operated at room temperature.

While shown and described herein as a device capable of being operated in high power, high frequency applications, it is understood that aspects of the invention further provide various alternative embodiments. For example, in one embodiment, the invention provides a method of manufacturing a device. The heterostructures of the illustrative devices 10A-10C shown in FIGS. 1-3, respectively, can be manufactured using any type of semiconductor material system. In an embodiment, devices 10A-10C comprise group-III nitride-based devices. To this extent, a heterostructure can be obtained and/or manufactured in which layers 12, 14 are formed of materials selected from the group-III nitride material system (e.g., $Al_xIn_yGa_{1-x-y}N$, where $0 \leq X$, $Y \leq 1$, and $X+Y \leq 1$ and/or alloys thereof). In a more particular embodiment, buffer layer 12 comprises GaN and barrier layer 14 comprises AlGaN. Alternatively, devices 10A-10C can comprise group-III arsenide-based devices, in which layers 12, 14 can be formed of materials selected from the group-III arsenide material system (e.g., $Al_xGa_{1-x}As$, where $0 \leq X \leq 1$, and/or alloys thereof). In an embodiment, the electron gas 16 formed at the heterojunction of layers 12, 14 can comprise a two-dimensional electron plane in which the electron states are quantized in one dimension.

The various layers can be formed on a substrate 11. Substrate 11 can comprise any type of substrate. In an embodiment, substrate 11 is transparent for the generated electromagnetic radiation 28. In this case, substrate 11 can comprise any type of substrate transparent to RF and/or THz radiation, such as sapphire. Each supplying terminal 20A, 20B can comprise, for example, an ohmic contact, which can be formed using any solution. Additionally, each controlling terminal(s) 22A-22D can comprise any type of contact, e.g., any type of gate electrode, which also can be formed using any solution. In an embodiment, one or more controlling terminal(s) 22A-22D comprises a metal-insulator-semiconductor structure, which includes one or more layers of any type of insulating material, such as a dielectric. The insulating material can include one or more of any type of uniform or composite dielectric layers. For example, the insulating material can include oxygen containing dielectric materials (e.g., $SiO_2$, $HfO_2$, or the like), nitrogen containing dielectric materials, such as a SiN compound (e.g., SiN, $Si_3N_4$), and/or the like. Further, a reflecting plane 26 can be formed on an opposite side of substrate 11 from layers 12, 14. Reflecting plane 26 can comprise any type of conducting material capable of reflecting all or substantially all of the electromagnetic radiation 28. For example, reflecting plane 26 can be formed of metal (e.g., gold). It is understood that, while not shown for clarity, a device, such as devices 10A-10C, can include one or more additional layers.

The manufacture of devices 10A-10C includes forming active region(s) 18 in the electron gas 16. A ratio of the electron concentration in the active region 18 to the electron concentrations of other non-active regions 19A-B of electron gas 16 can be adjusted using any solution, which results in the electron concentration of the active region 18 being lower than the electron concentrations of other non-active regions 19A-B of electron gas 16. In an embodiment, the manufacture of devices 10A-10D includes processing barrier layer 14 in a manner that is configured to adjust the electron concentration ratio. For example, in FIG. 1, device 10A includes an active region 18 that is defined by a region of electron gas 16 that is directly below a trench 30 formed in barrier layer 14. Trench 30 can be formed using any solution, e.g., by selectively etching a portion of barrier layer 14, selective growth (e.g., overgrowth and/or re-growth) of the non-trench portions of barrier layer 14, and/or the like. Alternatively, as shown in FIG. 3, one or more active regions 18A-18D can be defined by selective area surface treatment of corresponding areas 32A-32D of barrier layer 14. For example, areas 32A-32D can be subjected to selective area fluoride treatment applied to a surface of barrier layer 14. It is understood that numerous alternative approaches can be used to define one or more active areas, including, but not limited to, selective area coating using a surface charge or surface strain modification material, selective area doping, an effect of carrier trapping, and/or the like. Further, a combination of two or more approaches can be utilized to define one or more active areas.

In another embodiment, the invention provides a method of generating high frequency electromagnetic oscillations leading to electromagnetic radiation using a device described herein. In this case, using device 10A of FIG. 1 as an illustrative example, an illustrative method includes supplying a current between supplying terminals 20A, 20B, and applying a particular voltage to controlling terminal 22A. The supplied current and/or applied voltage can be adjusted to adjust one or more aspects of the resulting electromagnetic radiation 28, such as a radiation frequency or spatial distribution of the emitted electromagnetic radiation 28, coupling with additional circuitry, and/or the like. Using a device with multiple controlling terminals, such as controlling terminals 22A-22D of device 10C in FIG. 3, the method can include independent and/or identical adjustments to the voltages applied to one or more of the controlling terminals 22A-22D. During the operation of device 10A, reflecting plane 26 can create a resonant condition in device 10A by reflecting the electromagnetic radiation 28.

Figure 4:
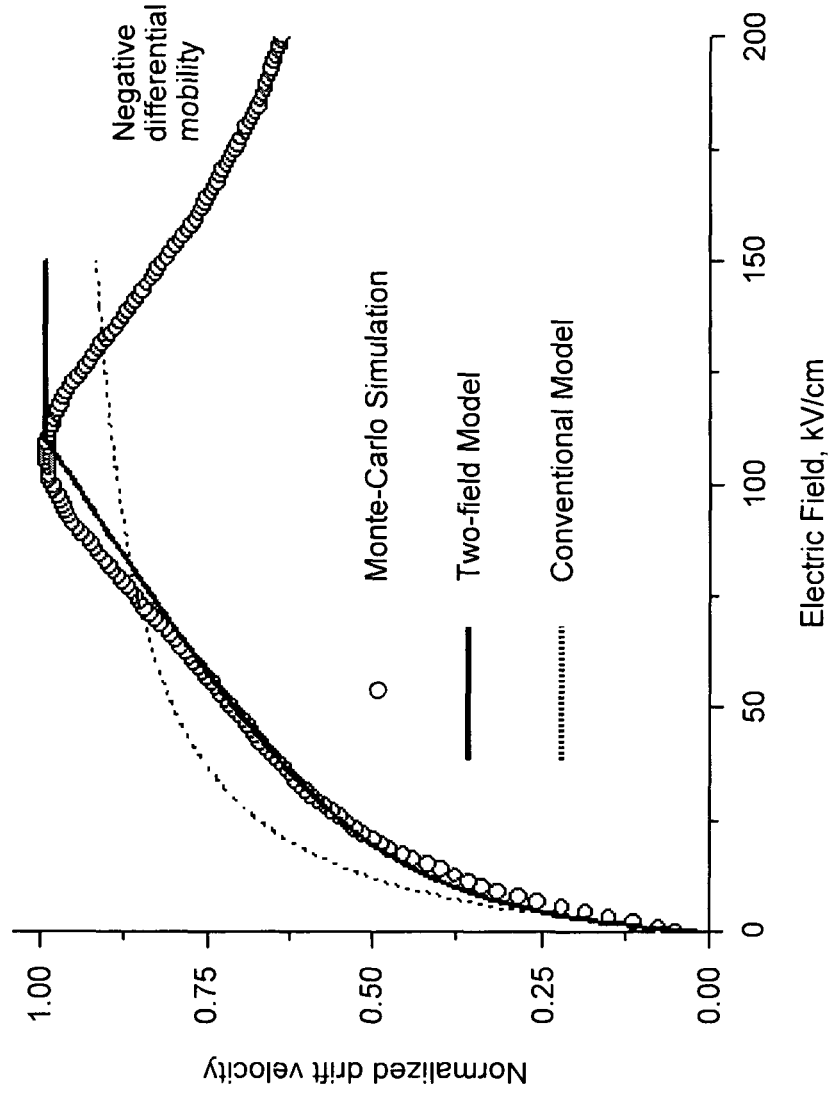
FIG. 4 shows the velocity-field dependence for an illustrative device according to an embodiment.

FIGS. 4-6B show some illustrative benefits and operating characteristics, which can be obtained using a device configured as described herein. To this extent, FIG. 4 shows the velocity-field dependence for an illustrative device according to an embodiment. In particular, the device comprises an AlGaN/GaN heterostructure including an active region with negative differential mobility. The maximum electron velocity is normalized to its maximum value, which current research indicates can easily reach up to $3 \times 10^7$ cm/s in GaN. Such high values of the electron velocity enable operation of the device at high frequencies. For example, a 0.1 micron distance can correspond to a transit time of approximately 0.3 picoseconds or to a frequency of approximately 3 terahertz.

FIG. 5 shows the electric field distributions in an active region 18 of an illustrative device 10D at various injection levels according to an embodiment. A portion of device 10D is shown, which includes a barrier layer 14, a controlling terminal 22, and a treated surface 32 (e.g., fluoride treated) of barrier layer 14, which defines active region 18 (within an electron gas, which is not shown). The properties of treated surface 32 can control the operation of device 10D. In particular, three injection levels are illustrated in which the injected sheet electron concentration, $n_S$, is greater than, approximately equal to, and less than the equilibrium (zero field) two-dimensional electron concentration in the active region 18, $n_{ST}$. As illustrated, distinct differences in the electric field distributions result from the different relations between $n_S$ and $n_{ST}$. The field distributions are drafted in suggestion that the electron velocity is not saturated under the controlling terminal 22.

Figure 6A:
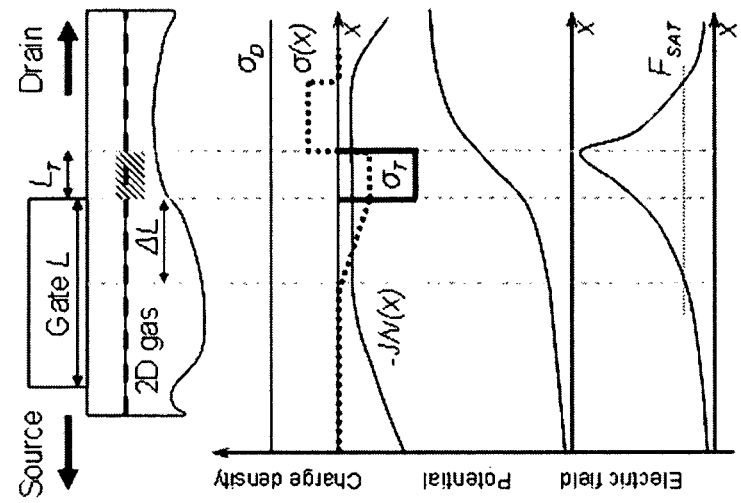
FIGS. 6A-6B compare the charge, electric potential, and electric field distributions for a conventional heterostructure field effect transistor and a device configured according to an embodiment of the invention.
Figure 6B:
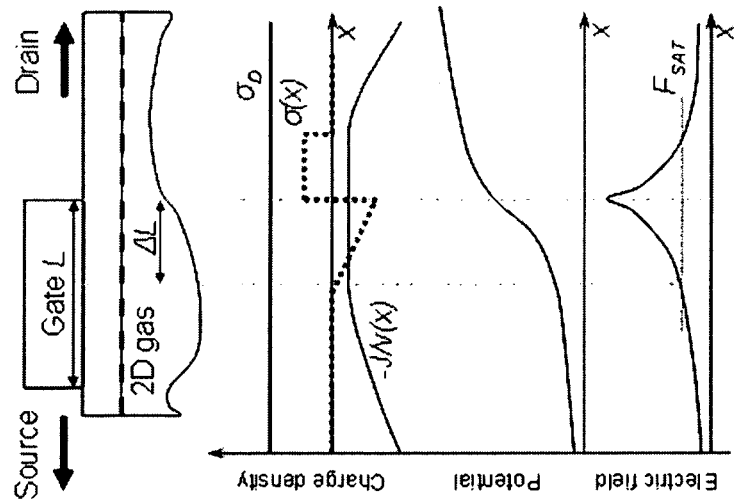

FIGS. 6A-6B compare the charge, electric potential, and electric field distributions for a conventional heterostructure field effect transistor (FIG. 6A) and a device configured according to an embodiment of the invention (FIG. 6B). As illustrated, in the conventional FET, the electric field peaks at an edge of the gate closest to the drain and quickly decreases into the bulk of the ungated portion of the structure. In contrast, in the device of FIG. 6B, the electric field peaks outside of the controlling electrode area, thereby allowing for oscillations of electron density due to negative differential mobility and/or plasma wave instability. The field distributions are drafted in suggestion that the electron velocity is not saturated under the controlling terminal over the distance $\Delta L$. In the device of FIG. 6B, the active region is defined using the carrier trapping effect over the length $L_T$, which is outside of the area below the controlling terminal.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A device comprising:
   a two-dimensional electron gas located between a first layer and a second layer;
   a first active region located in a portion of the electron gas, wherein the first active region comprises an electron concentration less than an electron concentration of a set of non-active regions of the electron gas;
   a first controlling terminal located on the second layer and on a first side of the first active region;
   a second active region formed in a second portion of the electron gas, wherein the second active region comprises an electron concentration less than an electron concentration of the set of non-active regions of the electron gas; and
   a second controlling terminal located on the second layer on the first side of the second active region, wherein the set of non-active regions includes regions of the electron gas located directly below the first and second controlling terminals, and wherein the electron concentrations result in an electric field within the electron gas peaking in the first and second active regions on a side opposite the corresponding first and second controlling terminals during steady state operation of the device.

2. The device of claim 1, further comprising a first supplying terminal located on the first side of the first active region and a second supplying terminal located on a second side of the first active region opposite the first side.

3. The device of claim 1, further comprising a second controlling terminal located on the second layer on a second side of the first active region opposite the first side.

4. The device of claim 1, wherein the second layer comprises a trench, wherein an area of the electron gas below the trench defines the first active region.

5. The device of claim 1, wherein the second layer comprises an area treated with fluoride, wherein an area of the electron gas below the area treated with fluoride defines the first active region.

6. The device of claim 1, further comprising:
   a substrate on which the first layer is located; and
   a reflector plane located on an opposite side of the substrate from the first layer.

7. The device of claim 1, wherein the two-dimensional electron gas is a two-dimensional free electron plane.

8. A method of manufacturing a device, the method comprising:
   forming a first active region in a portion of a two-dimensional electron gas located between a first layer and a second layer of a hetero structure, wherein the first active region comprises an electron concentration less than an electron concentration of a set of non-active regions of the electron gas;
   forming a first controlling terminal on the second layer and on a first side of the first active region;
   forming a second active region in a second portion of the electron gas, wherein the second active region comprises an electron concentration less than an electron concentration of the set of non-active regions of the electron gas; and
   forming a second controlling terminal located on the second layer on the first side of the second active region, wherein the set of non-active regions includes regions of the electron gas located directly below the first and second controlling terminals, and wherein the electron concentrations result in an electric field within the electron gas peaking in the first and second active regions on a side opposite the corresponding first and second controlling terminals during steady state operation of the device.

9. The method of claim 8, further comprising:
forming a first supplying terminal on the first side of the first active region; and
forming a second supplying terminal on a second side of the first active region opposite the first side.

10. The method of claim 8, further comprising forming a second controlling terminal on the second layer on a second side of the first active region opposite the first side.

11. The method of claim 8, wherein the forming the active region includes forming a trench in the second layer, wherein an area of the electron gas below the trench defines the first active region.

12. The method of claim 8, wherein the forming the active region includes treating an area of the second layer comprises an area treated with fluoride, wherein an area of the electron gas below the area treated with fluoride defines the first active region.

13. The method of claim 8, further comprising forming a reflector plane on an opposite side of a substrate on which the first layer is located.

14. A method of generating electromagnetic radiation, the method comprising:
supplying a current from a first supplying terminal to a second supplying terminal along a channel comprising a two-dimensional electron gas located between the first supplying terminal and the second supplying terminal to generate the electromagnetic radiation, the electron gas including a first active region in a first portion of the electron gas and a second active region in a second portion of the electron gas, the first and second active regions having electron concentrations less than an electron concentration of a set of non-active regions of the electron gas;
applying a first voltage to a first controlling terminal located on a first side of the first active region corresponding to the first supplying terminal to alter at least one characteristic of the electromagnetic radiation; and
applying a second voltage to a second controlling terminal located on the first side of the second active region corresponding to the first supplying terminal, wherein the set of non-active regions includes regions of the electron gas located directly below the first and second controlling terminals, and wherein the electron concentrations result in an electric field within the electron gas peaking in the first and second active regions on a side opposite the corresponding first and second controlling terminals during steady state operation.

15. The method of claim 14, further comprising applying a voltage to a second controlling terminal located on a second side of the first active region corresponding to the second supplying terminal.

16. The method of claim 14, further comprising reflecting at least some of the electromagnetic radiation towards the electron gas.

* * * * *